United States Patent
Chen et al.

(10) Patent No.: US 10,028,395 B2
(45) Date of Patent: Jul. 17, 2018

(54) FOLDABLE DISPLAY DEVICE AND HOLDING STRUCTURE THEREOF

(71) Applicant: E Ink Holdings Inc., Hsinchu (TW)

(72) Inventors: Yu-Wen Chen, Hsinchu (TW); Kuo-Hsing Cheng, Hsinchu (TW); Chun-Yu Lu, Hsinchu (TW); Yu-Chieh Hung, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/712,157

(22) Filed: Sep. 22, 2017

(65) Prior Publication Data
US 2018/0146560 A1 May 24, 2018

(30) Foreign Application Priority Data

Nov. 24, 2016 (CN) .......................... 2016 1 1051483

(51) Int. Cl.
| | | |
|---|---|---|
| *G06F 1/16* | (2006.01) | |
| *H05K 5/00* | (2006.01) | |
| *H05K 5/02* | (2006.01) | |
| *G02F 1/1333* | (2006.01) | |
| *H01L 51/52* | (2006.01) | |
| *G02F 1/167* | (2006.01) | |
| *H01L 51/00* | (2006.01) | |

(52) U.S. Cl.
CPC .......... *H05K 5/0017* (2013.01); *H05K 5/0217* (2013.01); *G02F 1/133305* (2013.01); *G02F 1/133308* (2013.01); *G02F 1/167* (2013.01); *H01L 51/0097* (2013.01); *H01L 51/5237* (2013.01); *H01L 2251/5338* (2013.01)

(58) Field of Classification Search
None
See application file for complete search history.

(56) References Cited

U.S. PATENT DOCUMENTS

| 8,634,873 B2 | 1/2014 | Jones |
| 9,047,799 B2* | 6/2015 | Yamazaki ............ G06F 1/1616 |

(Continued)

FOREIGN PATENT DOCUMENTS

| TW | 522775 B | 3/2003 |
| TW | M502867 U | 6/2015 |
| TW | 201610643 A | 3/2016 |

OTHER PUBLICATIONS

Corresponding Taiwanese office action dated Jul. 5, 2017.

*Primary Examiner* — Xanthia C Cunningham
(74) *Attorney, Agent, or Firm* — CKC & Partners Co., Ltd.

(57) ABSTRACT

A foldable display device includes a holding structure and a flexible display panel. The holding structure includes a housing, a first supporting stage, a second supporting stage, a supporting element, and a first flexible element. A third portion of the housing is pivotally connected to a first portion and a second portion of the housing. The third portion of the housing has an accommodating space. The first supporting stage is located on the first portion of the housing. The second supporting stage is located on the second portion of the housing. A gap is formed between the portion of the second supporting stage and the portion of the first supporting stage. The supporting element is located in the accommodating space. Two ends of the first flexible element are respectively connected to the supporting element and the third portion of the housing.

18 Claims, 5 Drawing Sheets

(56) References Cited

U.S. PATENT DOCUMENTS

| | | | |
|---|---|---|---|
| 9,173,288 B1* | 10/2015 | Kim | G06F 1/1633 |
| 9,179,559 B1* | 11/2015 | Kim | G06F 1/1616 |
| 9,204,565 B1* | 12/2015 | Lee | E05D 7/00 |
| 9,348,450 B1* | 5/2016 | Kim | G06F 1/1681 |
| 9,535,452 B2* | 1/2017 | Ahn | H05K 5/0017 |
| 9,826,626 B2* | 11/2017 | Myeong | H05K 1/028 |
| 9,905,795 B2* | 2/2018 | Matsueda | H01L 51/5237 |
| 2012/0243207 A1* | 9/2012 | Wang | G09F 9/30 |
| | | | 362/97.1 |
| 2015/0153780 A1 | 6/2015 | Maatta et al. | |
| 2015/0366089 A1* | 12/2015 | Park | G06F 1/1641 |
| | | | 361/679.01 |
| 2016/0037625 A1 | 2/2016 | Huitema et al. | |
| 2016/0132074 A1 | 5/2016 | Kim et al. | |
| 2016/0216737 A1* | 7/2016 | Hayk | G06F 1/1652 |
| 2016/0378203 A1* | 12/2016 | Kim | G06F 1/1616 |
| | | | 345/156 |

* cited by examiner

FOLDABLE DISPLAY DEVICE AND HOLDING STRUCTURE THEREOF

RELATED APPLICATIONS

This application claims priority to China Application Serial Number 201611051483.3, Nov. 24, 2016, which is herein incorporated by reference.

BACKGROUND

Field of Invention

The present invention relates to a foldable display device and a holding structure of the foldable display device.

Description of Related Art

Since foldable display panels (e.g., electrophoretic display panels) have been presented to the public, foldable display devices have been available in the market of electronic products today. A foldable display device has a foldable housing, and a flexible display panel is disposed on the foldable housing. Users may spread or fold the flexible display panel by unfolding or folding the housing. In general, the housing may have two portions that are connected by hinges, and the flexible display panel is disposed on two supporting stages that are respectively in the two portions of the housing, and the flexible display panel may be presented in a spread state or a folded state in accordance with the housing that is unfolded or folded.

However, the folded state of the display device may cause a bending area of the flexible display panel to cause deformation. Therefore, when the foldable display device is changed to a spread state from a folded state, the display panel cannot be held flat if there is no support under the bending area of the flexible display panel between the two supporting stages (i.e., the bending area is suspended in midair) or no sufficient supporting force exists under the bending area. As a result, when a user watches or operates the flexible display panel in a spread state, the user may have poor visual effect.

SUMMARY

An aspect of the present invention is to provide a foldable display device.

According to an embodiment of the present invention, a foldable display device includes a holding structure and a flexible display panel. The holding structure includes a housing, a first supporting stage, a second supporting stage, a supporting element, and a first flexible element. The housing has a first portion, a second portion, and a third portion. The third portion is pivotally connected to the first portion and the second portion, and the third portion has an accommodating space. The first supporting stage is located on the first portion of the housing, and a portion of the first supporting stage protrudes from the first portion of the housing. The second supporting stage is located on the second portion of the housing, and a portion of the second supporting stage protrudes from the second portion of the housing. A gap is formed between the portion of the second supporting stage and the portion of the first supporting stage. The supporting element is located in the accommodating space. Two ends of the first flexible element are respectively connected to the supporting element and the third portion of the housing, and an axial direction of the first flexible element is perpendicular to the third portion of the housing. The flexible display panel is located on the first supporting stage and the second supporting stage, and covers the gap.

In one embodiment of the present invention, the supporting element includes a main body and a protruding portion. The main body is connected to an end of the first flexible element. The protruding portion is located on a surface of the main body facing away from the first flexible element.

In one embodiment of the present invention, a width of the main body is substantially the same as a width of the accommodating space.

In one embodiment of the present invention, a position of the protruding portion corresponds to a position of the gap.

In one embodiment of the present invention, a width of the protruding portion is substantially the same as a width of the gap.

In one embodiment of the present invention, the main body is abutted against the first supporting stage and the second supporting stage.

In one embodiment of the present invention, the protruding portion is coupled with the gap, and is abutted against the flexible display panel.

In one embodiment of the present invention, the foldable display device further includes a second flexible element. Two ends of the second flexible element are respectively connected to the first portion of the housing and an edge of the first supporting stage facing away from the supporting element.

In one embodiment of the present invention, the foldable display device further includes a second flexible element. Two ends of the second flexible element are respectively connected to the second portion of the housing and an edge of the second supporting stage facing away from the supporting element.

In one embodiment of the present invention, the first flexible element is a spring or a rubber pillar.

In one embodiment of the present invention, the flexible display panel is an electrophoretic display panel or an organic light-emitting diode display panel.

Another aspect of the present invention is to provide a holding structure.

According to an embodiment of the present invention, a holding structure includes a housing, a first supporting stage, a second supporting stage, a supporting element, and a first flexible element. The housing has a first portion, a second portion, and a third portion. The third portion is pivotally connected to the first portion and the second portion, and the third portion has an accommodating space. The first supporting stage is located on the first portion of the housing, and a portion of the first supporting stage protrudes from the first portion of the housing. The second supporting stage is located on the second portion of the housing, and a portion of the second supporting stage protrudes from the second portion of the housing. A gap is formed between the portion of the second supporting stage and the portion of the first supporting stage. The supporting element is located in the accommodating space. Two ends of the first flexible element are respectively connected to the supporting element and the third portion of the housing, and an axial direction of the first flexible element is perpendicular to the third portion of the housing.

In the aforementioned embodiment of the present invention, since the two ends of the first flexible element are respectively connected to the supporting element and the third portion of the housing, and the axial direction of the first flexible element is perpendicular to the third portion of the housing, the supporting element may be moved toward the gap between the first and second supporting stages by the elastic force of the first flexible element, such that the supporting element may be utilized to fill in the gap between the first and second supporting stages, and prevents a bending area of the flexible display panel covering the gap from being suspended without support. As a result, when a user watches or operates the flexible display panel in a spread state, the flexible display panel may be held flat by the supporting element, the first supporting stage and the second supporting stage, thereby improving visual effect for the user.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
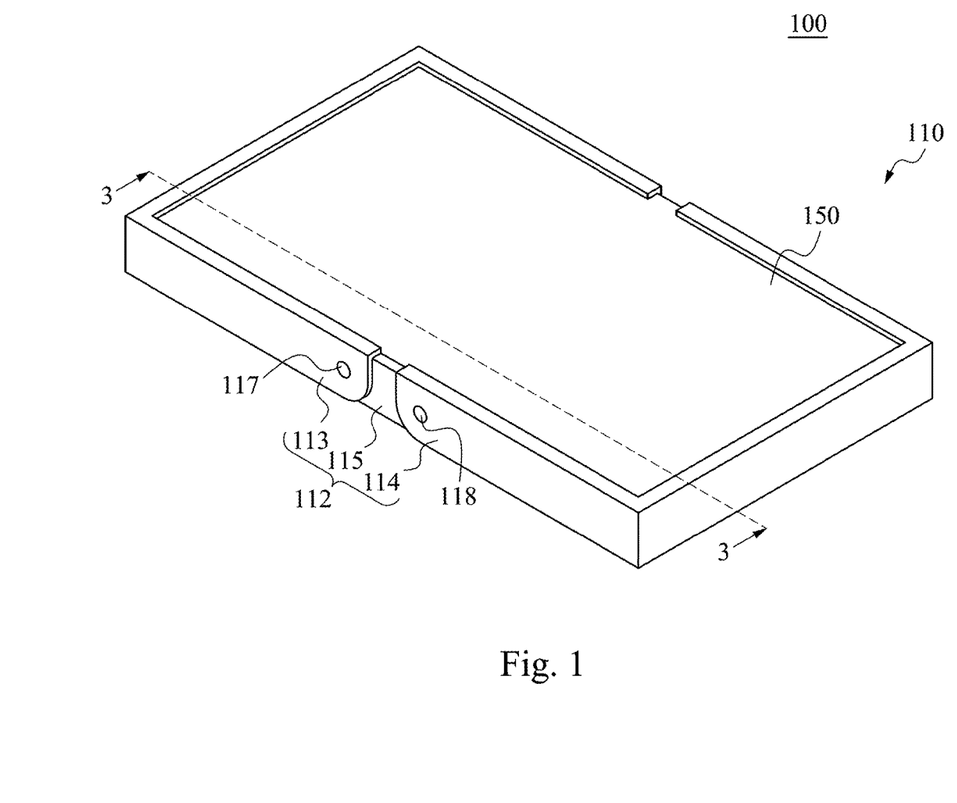
FIG. 1 is a perspective view of a foldable display device according to one embodiment of the present invention, in which the foldable display device is in a spread state.
Figure 2:
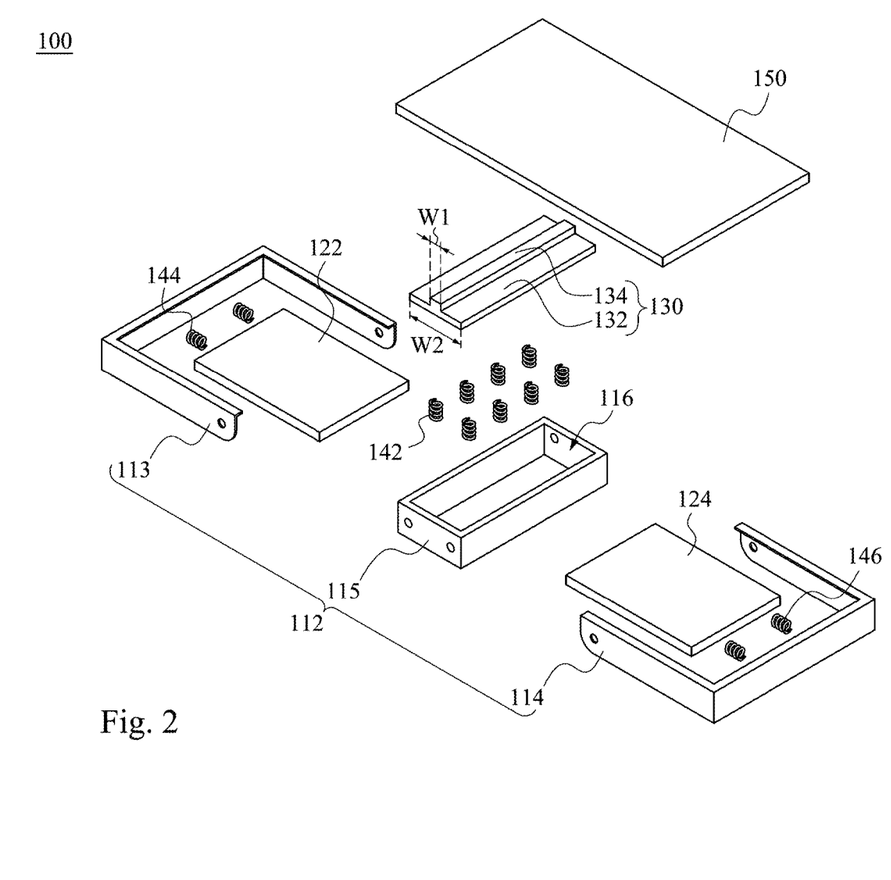
FIG. 2 is an exploded view of the foldable display device shown in FIG. 1.

FIG. 1 is a perspective view of a foldable display device 100 according to one embodiment of the present invention, in which the foldable display device 100 is in a spread state. FIG. 2 is an exploded view of the foldable display device 100 shown in FIG. 1. As shown in FIG. 1 and FIG. 2, the foldable display device 100 includes a holding structure 110 and a flexible display panel 150. The holding structure 110 includes a housing 112, a first supporting stage 122, a second supporting stage 124, a supporting element 130, and a first flexible element 142. The housing 112 has a first portion 113, a second portion 114, and a third portion 115. The third portion 115 of the housing 112 is pivotally connected to the first portion 113 and the second portion 114 of the housing 112, such that the first portion 113 and the second portion 114 may be respectively pivoted and rotated on the left side and the right side of the third portion 115. For example, a hinge 117 may be utilized to connect the first portion 113 and the third portion 115 of the housing 112, and a hinge 118 may be utilized to connect the second portion 114 and the third portion 115 of the housing 112. In this embodiment, the first portion 113 and the second portion 114 of the housing 112 may be in a symmetrical arrangement relative to the third portion 115, and the first supporting stage 122 and the second supporting stage 124 may also be in a symmetrical arrangement relative to the third portion 115.

Moreover, the third portion 115 of the housing 112 has an accommodating space 116. The supporting element 130 is located in the accommodating space 116 of the third portion 115 of the housing 112. Two ends of the first flexible element 142 are respectively connected to the supporting element 130 and the third portion 115 of the housing 112, and an axial direction of the first flexible element 142 is perpendicular to the third portion 115 of the housing 112. As a result of such a configuration, when the supporting element 130 is subject to a downward force, the first flexible element 142 can be compressed such that the supporting element 130 may move downward in the accommodating space 116. When the force is removed, the supporting element 130 may return to an initial position in the accommodating space 116 by an elastic recovery force of the first flexible element 142.

Figure 3:
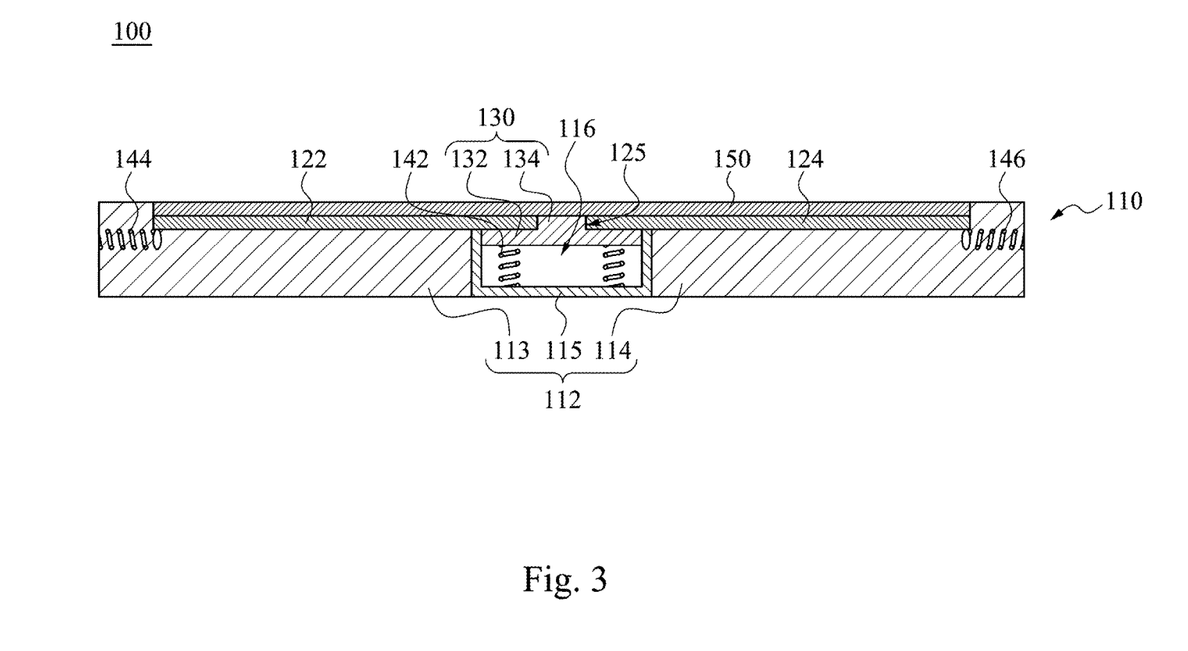
FIG. 3 is a cross-sectional view of the foldable display device taken along line 3-3 shown in FIG. 1.

FIG. 3 is a cross-sectional view of the foldable display device 100 taken along line 3-3 shown in FIG. 1. As shown in FIG. 1 and FIG. 3, the first supporting stage 122 is located on the first portion 113 of the housing 112, and a portion of the first supporting stage 122 protrudes from the first portion 113 of the housing 112. For example, in FIG. 3, the first supporting stage 122 protrudes rightward from the first portion 113 of the housing 112. The second supporting stage 124 is located on the second portion 114 of the housing 112, and a portion of the second supporting stage 124 protrudes from the second portion 114 of the housing 112. For example, in FIG. 3, the second supporting stage 124 protrudes leftward from the second portion 114 of the housing 112. A gap 125 is formed between the protruding portion of the second supporting stage 124 and the protruding portion of the first supporting stage 122.

The flexible display panel 150 is located on the first supporting stage 122 and the second supporting stage 124, and covers the gap 125. The gap 125 may facilitate the bending of the flexible display panel 150 that is above the gap 125. In this embodiment, the flexible display panel 150 may be an electrophoretic display (EPD) panel or an organic light-emitting diode (OLED) display panel, but the present invention is not limited in this regard.

Since the two ends of the first flexible element 142 are respectively connected to the supporting element 130 and the third portion 115 of the housing 112, and the axial direction of the first flexible element 142 is perpendicular to the third portion 115 of the housing 112, the supporting element 130 may be moved toward the gap 125 between the first and second supporting stages 122 by the elastic force of the first flexible element 142, 124, such that the supporting element 130 may be utilized to fill in the gap 125 between the first and second supporting stages 122, 124, and prevents a bending area of the flexible display panel 150 covering the gap 125 from being suspended without support. As a result, when a user watches or operates the flexible display panel 150 in a spread state, the flexible display panel 150 may be held flat by the supporting element 130, the first and second supporting stages 122, 124, thereby improving visual effect for the user.

As shown in FIG. 2 and FIG. 3, the supporting element 130 may include a main body 132 and a protruding portion 134. The main body 132 is connected to an end of the first flexible element 142. The protruding portion 134 is located on a surface of the main body 132 facing away from the first flexible element 142. A position of the protruding portion 134 corresponds to a position of the gap 125. In other words, the protruding portion 134 is aligned with the gap 125. When the foldable display device 100 is in a spread state, the main body 132 of the supporting element 130 may be abutted against the first and second supporting stages 122, 124 due to the elastic force of the first flexible element 142, and the protruding portion 134 of the supporting element 130 may be coupled with the gap 125 and may be abutted against the flexible display panel 150.

In this embodiment, a width W1 of the protruding portion 134 may be substantially the same as a width of the gap 125, and a width W2 of the main body 132 may be substantially the same as a width of the accommodating space 116, thereby ensuring the supporting element 130 to move toward or away from the gap 125 (i.e., along the axial direction of the first flexible element 142) without deviation. In this embodiment, the width W1 of the protruding portion 134 is smaller than the width W2 of the main body 132, and the width of the gap 125 is smaller than the width of the accommodating space 116.

The foldable display device 100 further includes second flexible elements 144, 146. Two ends of the second flexible element 144 are respectively connected to the first portion 113 of the housing 112 and an edge of the first supporting stage 122 facing away from the supporting element 130. Two ends of the second flexible element 146 are respectively connected to the second portion 114 of the housing 112 and an edge of the second supporting stage 124 facing away from the supporting element 130. The second flexible elements 144, 146 may respectively enable the first and second supporting stages 122, 124 to move on the first and second portions 113, 114 of the housing 112. The elastic forces of the second flexible elements 144, 146 can ensure to the first and second supporting stages 122, 124 to be abutted against the supporting element 130. In this embodiment, the first flexible element 142 and the second flexible elements 144, 146 may be springs, but the present invention is not limited in this regard. Other elastic materials may also be used as the first flexible element 142 and the second flexible elements 144, 146, such as rubber, silicone, or soft plastic.

In addition, when the holding structure 110 does not carry the flexible display panel 150, the first and second supporting stages 122, 124 are exposed though the housing 112. In other embodiments, the holding structure 110 may be utilized to carry other flexible objects, such as a photograph, a paper, a metal sheet, leather, cloth, etc., and the present invention is not limited in this regard.

It is to be noted that the connection relationships and materials of the aforementioned elements will not be described again in the following description. In the following description, a different state of using the foldable display device 100 will be described.

Figure 4:
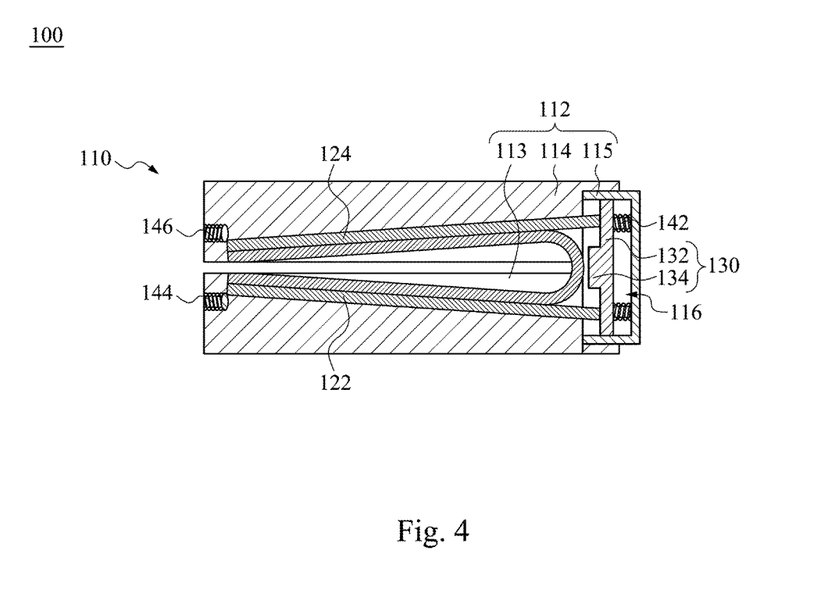
FIG. 4 is a cross-sectional view of the foldable display device shown in FIG. 3 when being in a folded state.

FIG. 4 is a cross-sectional view of the foldable display device 100 shown in FIG. 3 when being in a folded state. As shown in FIG. 3 and FIG. 4, when the foldable display device 100 is changed to a folded state from a spread state, the first portion 113 and the second portion 114 of the housing 112 may pivotally rotate on the third portion 115 through the hinges 117, 118 (see FIG. 1), and then the protruding portions of the first and second supporting stages 122, 124 may press the supporting element 130, such that the first and second supporting stages 122, 124 may be moved respectively along with the first and second portions 113, 114 of the housing 112. Meanwhile, the supporting element 130 may compress the first flexible element 142, and the flexible display panel 150 may be bent along with the movements of the first and second supporting stages 122, 124. When the first and second portions 113, 114 of the housing 112 overlap with each other, the foldable display device 100 in a folded state shown in FIG. 4 may be obtained.

Figure 5:
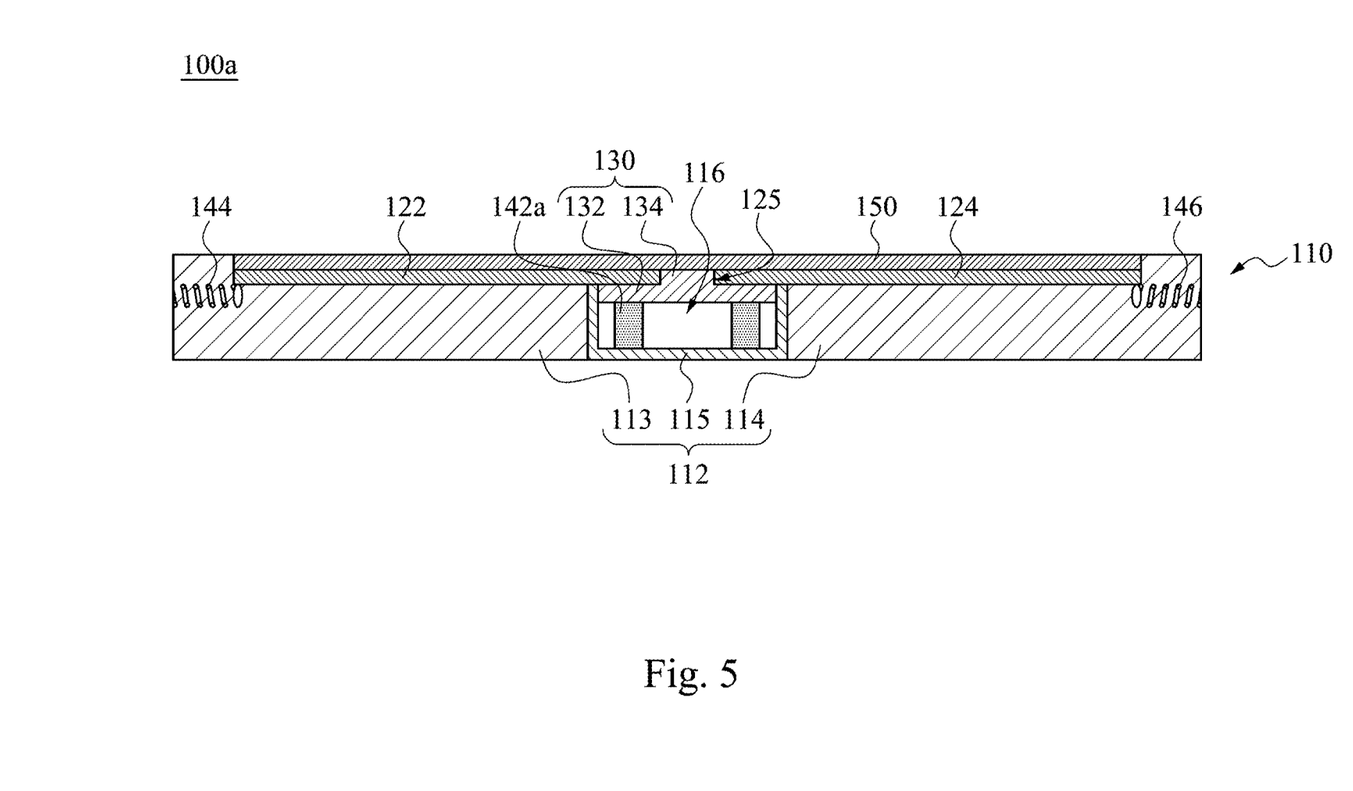
FIG. 5 is a cross-sectional view of a foldable display device according to one embodiment of the present invention, in which the foldable display device is in a spread state.

FIG. 5 is a cross-sectional view of a foldable display device 100a according to one embodiment of the present invention, in which the foldable display device 100a is in a spread state. As shown in FIG. 5, the foldable display device 100a includes the holding structure 110 and the flexible display panel 150. The holding structure 110 includes the housing 112, the first supporting stage 122, the second supporting stage 124, the supporting element 130, and a first flexible element 142a. The difference between this embodiment and the embodiment shown in FIG. 3 is that the first flexible element 142a is a rubber pillar, but not a spring.

As a result of such a configuration, the supporting element 130 may be moved toward the gap 125 between the first and second supporting stages 122, 124 by the elastic force of the first flexible element 142a, such that the supporting element 130 may be utilized to fill in the gap 125 between the first and second supporting stages 122, 124, and prevents the bending area of the flexible display panel 150 covering the gap 125 from being suspended without support. As a result, when a user watches or operates the flexible display panel 150 in a spread state, the flexible display panel 150 may be held flat by the supporting element 130 and the first and second supporting stages 122, 124, thereby improving visual effect for the user. In addition, when the foldable display device 100a is changed to a folded state from a spread state, the first and second supporting stages 122, 124 may press the supporting element 130 to compress the first flexible element 142a, such that the flexible display panel 150 may be bent along with the movements of the first and second supporting stages 122, 124.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A foldable display device, comprising:
   a holding structure, comprising:
   a housing having a first portion, a second portion, and a third portion, wherein the third portion is pivotally connected to the first portion and the second portion, and the third portion has an accommodating space;
   a first supporting stage located on the first portion of the housing, wherein a portion of the first supporting stage protrudes from the first portion of the housing;
   a second supporting stage located on the second portion of the housing, wherein a portion of the second supporting stage protrudes from the second portion of the housing, and a gap is formed between the portion of the second supporting stage and the portion of the first supporting stage;
   a supporting element located in the accommodating space; and
   a first flexible element, wherein two ends of the first flexible element are respectively connected to the supporting element and the third portion of the housing, and an axial direction of the first flexible element is perpendicular to the third portion of the housing; and a flexible display panel which is located on the first supporting stage and the second supporting stage and covers the gap;

wherein the supporting element comprises: a main body connected to an end of the first flexible element; and a protruding portion located on a surface of the main body facing away from the first flexible element.

2. The foldable display device of claim 1, wherein a width of the main body is substantially the same as a width of the accommodating space.

3. The foldable display device of claim 1, wherein a position of the protruding portion corresponds to a position of the gap.

4. The foldable display device of claim 1, wherein a width of the protruding portion is substantially the same as a width of the gap.

5. The foldable display device of claim 1, wherein the main body is abutted against the first supporting stage and the second supporting stage.

6. The foldable display device of claim 1, wherein the protruding portion is coupled with the gap and is abutted against the flexible display panel.

7. The foldable display device of claim 1, further comprising:
a second flexible element, wherein two ends of the second flexible element are respectively connected to the first portion of the housing and an edge of the first supporting stage facing away from the supporting element.

8. The foldable display device of claim 1, further comprising:
a second flexible element, wherein two ends of the second flexible element are respectively connected to the second portion of the housing, and an edge of the second supporting stage facing away from the supporting element.

9. The foldable display device of claim 1, wherein the first flexible element is a spring or a rubber pillar.

10. The foldable display device of claim 1, wherein the flexible display panel is an electrophoretic display panel or an organic light-emitting diode display panel.

11. A holding structure, comprising:
a housing having a first portion, a second portion, and a third portion, wherein the third portion is pivotally connected to the first portion and the second portion, and the third portion has an accommodating space;
a first supporting stage located on the first portion of the housing, wherein a portion of the first supporting stage protrudes from the first portion of the housing;
a second supporting stage located on the second portion of the housing, wherein a portion of the second supporting stage protrudes from the second portion of the housing, and a gap is formed between the portion of the second supporting stage and the portion of the first supporting stage;
a supporting element located in the accommodating space; and
a first flexible element, wherein two ends of the first flexible element are respectively connected to the supporting element and the third portion of the housing, and an axial direction of the first flexible element is perpendicular to the third portion of the housing;
wherein the supporting element comprises: a main body connected to an end of the first flexible element; and a protruding portion located on a surface of the main body facing away from the first flexible element.

12. The holding structure of claim 11, wherein a width of the main body is substantially the same as a width of the accommodating space.

13. The holding structure of claim 11, wherein a position of the protruding portion corresponds to a position of the gap.

14. The holding structure of claim 11, wherein a width of the protruding portion is substantially the same as a width of the gap.

15. The holding structure of claim 11, wherein the main body is abutted against the first supporting stage and the second supporting stage.

16. The holding structure of claim 11, further comprising:
a second flexible element, wherein two ends of the second flexible element are respectively connected to the first portion of the housing and an edge of the first supporting stage facing away from the supporting element.

17. The holding structure of claim 11, further comprising:
a second flexible element, wherein two ends of the second flexible element are respectively connected to the second portion of the housing and an edge of the second supporting stage facing away from the supporting element.

18. The holding structure of claim 11, wherein the first flexible element is a spring or a rubber pillar.

* * * * *